United States Patent [19]

Wang et al.

[11] 4,376,672
[45] Mar. 15, 1983

[54] MATERIALS AND METHODS FOR PLASMA ETCHING OF OXIDES AND NITRIDES OF SILICON

[75] Inventors: David N. Wang, Cupertino; Frank D. Egitto, Santa Clara; Dan Maydan, Los Altos, all of Calif.

[73] Assignee: Applied Materials, Inc., Santa Clara, Calif.

[21] Appl. No.: 315,133

[22] Filed: Oct. 26, 1981

[51] Int. Cl.³ .................. B44C 1/22; C03C 15/00; C03C 25/06; H01L 21/306

[52] U.S. Cl. .................. 156/643; 156/345; 156/644; 156/646; 156/657; 156/659.1; 204/192 E; 204/298; 252/79.1; 430/313; 430/317

[58] Field of Search .......... 156/643, 644, 646, 653, 156/657, 659.1, 345, 662; 430/313, 317; 427/38, 39; 252/79.1; 204/164, 192 E, 298

[56] References Cited

U.S. PATENT DOCUMENTS

| | | | |
|---|---|---|---|
| 3,795,557 | 3/1974 | Jacob | 156/622 X |
| 3,800,684 | 4/1975 | Abe | 156/646 |
| 4,174,251 | 11/1979 | Paschke | 156/643 |
| 4,243,476 | 1/1981 | Ahn et al. | 204/192 E X |
| 4,253,907 | 3/1981 | Parry et al. | 156/646 X |
| 4,260,649 | 4/1981 | Dension et al. | 427/53.1 |

FOREIGN PATENT DOCUMENTS 5569264  5/1980  Japan .................. 156/646

OTHER PUBLICATIONS

Abstract of Japanese Patent No. 53-14571, Etching Method and Mixed Gas For Etching by Kokai, 9/2/78, one page.

*Primary Examiner*—William A. Powell
*Attorney, Agent, or Firm*—Flehr, Hohbach, Test, Albritton & Herbert

[57] ABSTRACT

A method for etching a layer of inorganic insulating material formed on a semiconductor wafer and containing silicon as the principal metallic element. The method involves disposing a wafer on one of a pair of electrode structures in a closed chamber. A reactive gas mixture comprising principally a fluorocarbon gas doped with a preselected quantity of carbon dioxide is supplied to the chamber.

Radio frequency electrical energy is supplied to one of the electrode structures to create a plasma of the reactive gas mixture for chemically attacking the insulating material.

12 Claims, 19 Drawing Figures

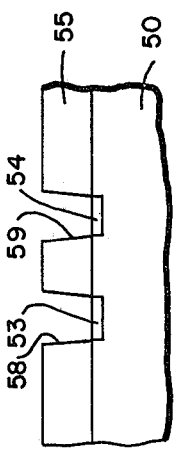
FIG.—7
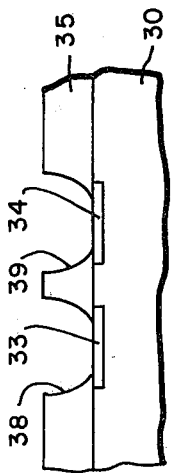
FIG.—8
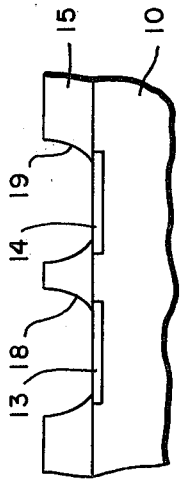
FIG.—9
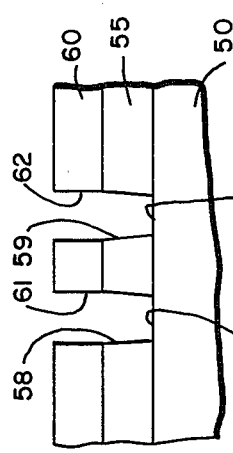
FIG.—4
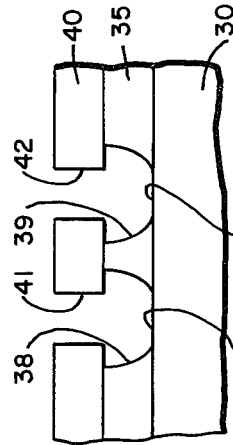
FIG.—5
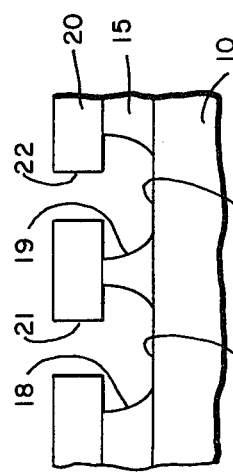
FIG.—6
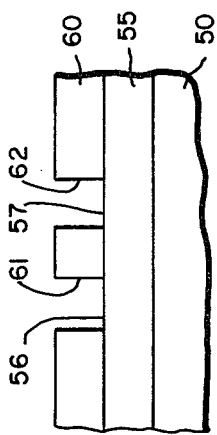
FIG.—1
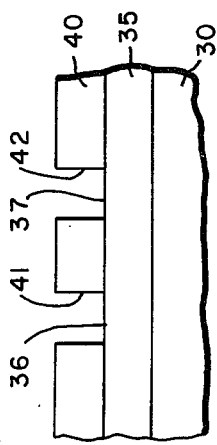
FIG.—2
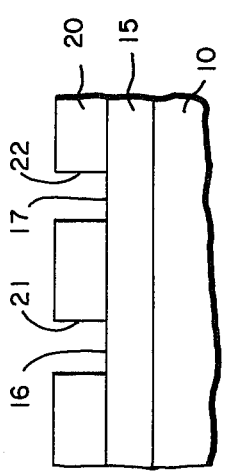
FIG.—3

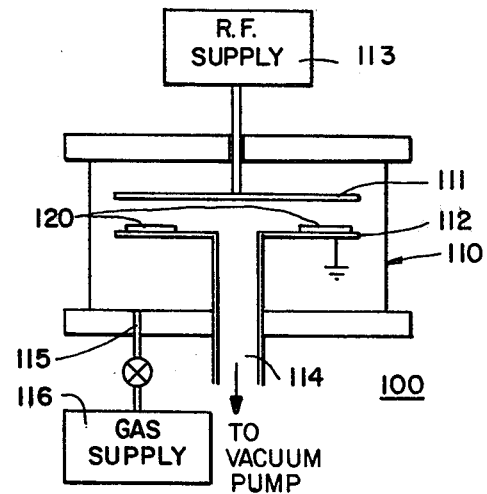
FIG.—10
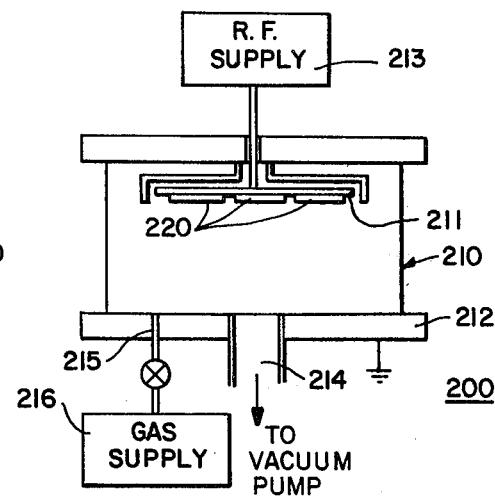
FIG.—11A
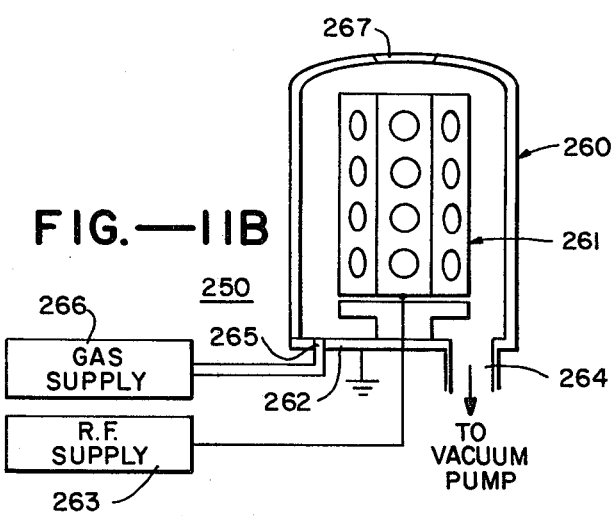
FIG.—11B
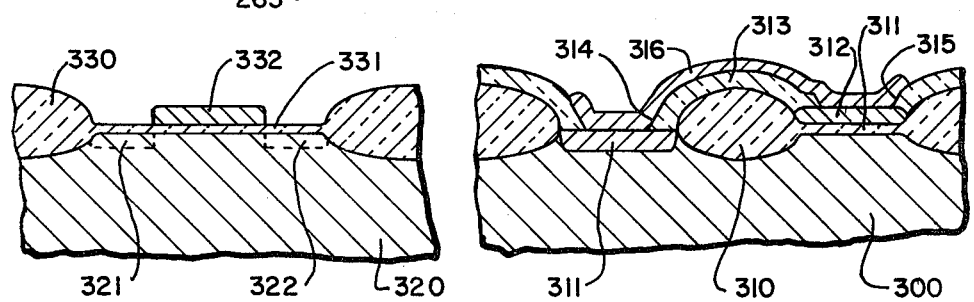
FIG.—12  FIG.—13

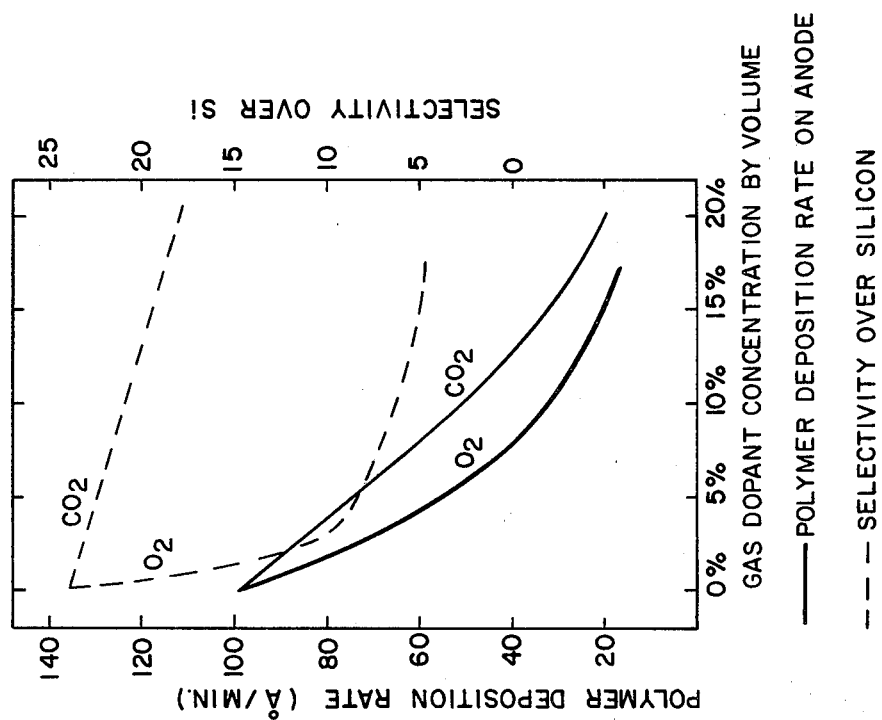
FIG.—16
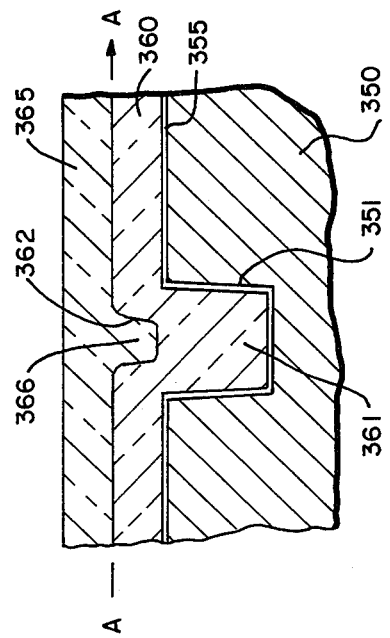
FIG.—14
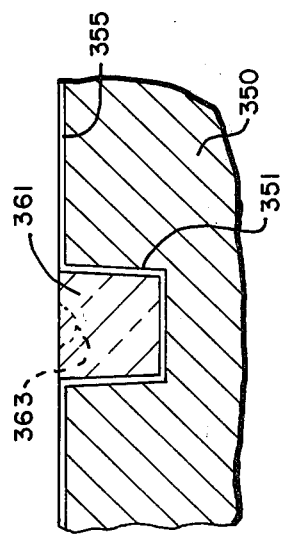
FIG.—15

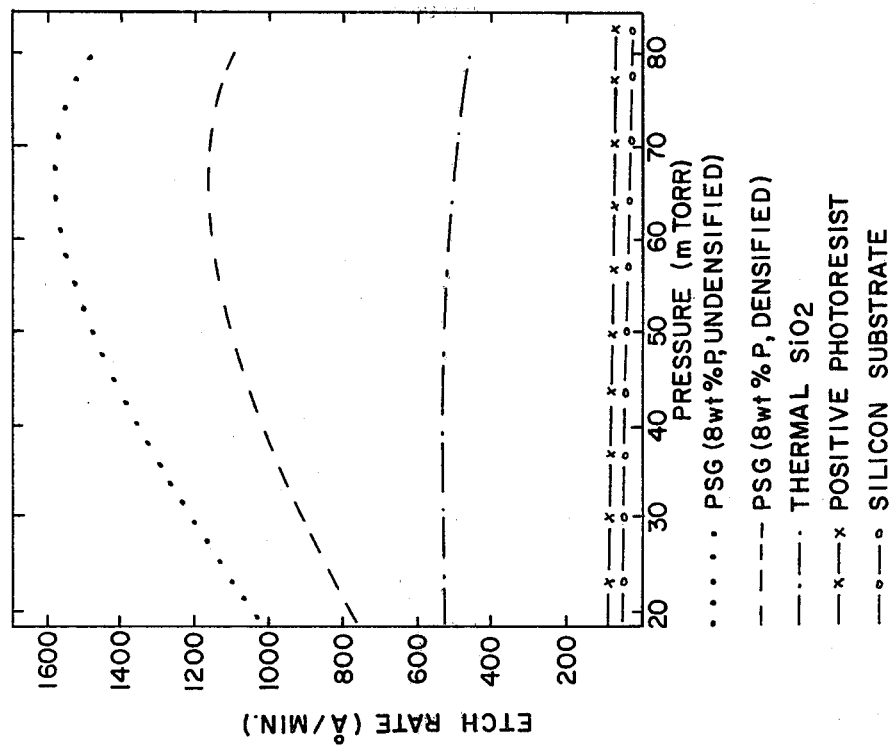
FIG.—18
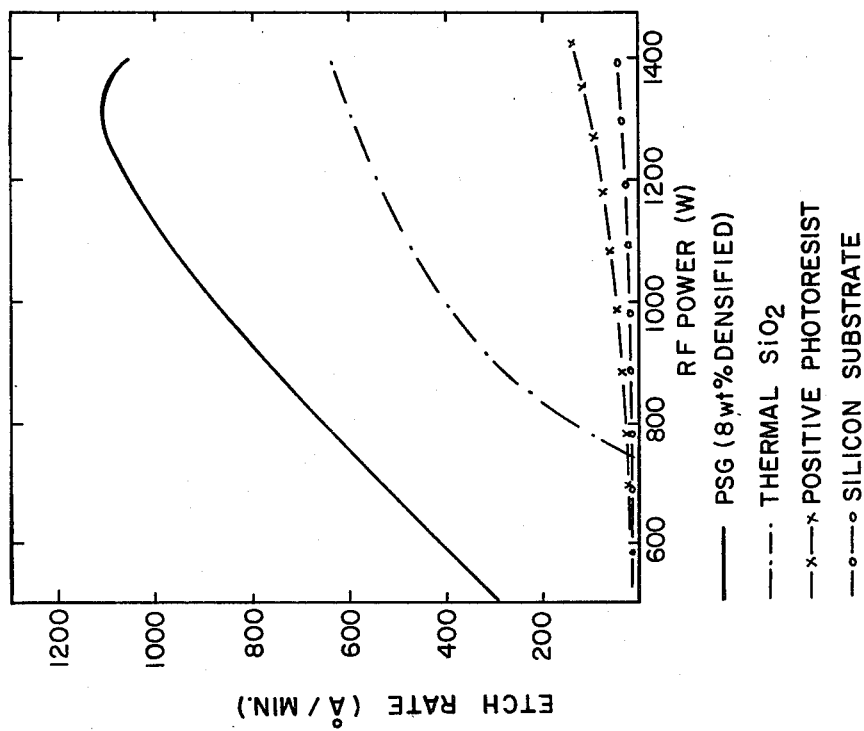
FIG.—17

MATERIALS AND METHODS FOR PLASMA ETCHING OF OXIDES AND NITRIDES OF SILICON

This invention relates generally to reactive gas chemistry for plasma etching of layers of material used in fabrication of semiconductor integrated circuits and methods for plasma etching of such materials. More specifically, this invention relates to methods for plasma etching of inorganic insulating materials having silicon as their principal metallic constituent and to reactive plasma gas chemistry systems for use in such methods.

Integrated circuit (IC) technologies for manufacturing conductor-insulator-semiconductor field effect transistor (CISFET) devices and bipolar transistor devices involve the formation of a large number of individual transistors and related circuit elements (such as diodes, resistors and capacitors) on one chip. Furthermore, a large number of identical chips are fabricated simultaneously on a semiconductor wafer which is typically processed along with other identical wafers through a sequence of individual and batch processing operations. Over the past several years, the level of integration of devices on individual IC chips has increased dramatically. Important contributors to achieving increased levels of device integration have been improvements in lithography technology and etching technology which are at the heart of all semiconductor IC fabrication.

Over the past several years improvements in photolithography have resulted in substantial reductions in minimum photolithography feature size. Development of positive photoresist materials, high resolution electron beam photomask pattern generation equipment, and projection mask alignment and resist exposure systems have reduced minium photolithography feature size to the 1-2.5 micron range. More recently, substantial research and development efforts have been directed to developing ion beam and X-ray lithography systems which show promise in reducing minimum photolithography feature size to the submicron region.

While IC device density is determined principally by the resolution of the lithography technology utilized, i.e. minimum photolithography feature size, improvements in resolution of lithography cannot be effectively utilized if the high resolution mask pattern formed in the resist layer cannot be accurately and reproducibly replicated into the underlying layer on the semiconductor wafer by the etching technology utilized.

Effective utilization of the resolution of currently available optical photolithography technology is not possible with wet chemical etching systems because of the inherent isotropic nature of the chemical attack of liquid etchants on exposed sections of material layers underlying a patterned photoresist layer. In addition, because of surface tension effects in liquids, wet chemical etchants have difficulty penetrating 1-1.5 micron apertures in a photoresist layer. Furthermore, some of the wet chemical etchants which must be employed for etch selectivity are dangerous due to high toxicity and the possibility of acid burns to personnel. Consequently, substantial research and development has been directed toward the development of plasma etching systems (also called dry etching technology). Plasma etching technology generally holds the promise of providing improvements in directional etching (i.e. anisotropic etching) together with greater safety, since plasma etching equipment generally involves a closed reaction chamber and thus no exposure of processing personnel to dangerous chemicals.

There are basically two types of plasma etching systems. Referring briefly to FIGS. 10 and 11A the differences between the structure and operation of a parallel plate plasma chemical etching system as depicted in FIG. 10 and a parallel plate reactive ion etching system as depicted in FIG. 11A will be discussed. Each of the systems is shown in a highly schematic form without intending to represent any commercially available or commercially useful apparatus. The common aspects of the two systems are that each involves a substantially closed reaction chamber 110, 210 with a connection 114, 214 to a vacuum pump for partially evacuating the interior of the chamber, and a gas supply 116, 216 for communicating the reactive gas to the chamber through a valve conduit arrangement 115, 215. Furthermore each of the systems utilizes an rf energy supply 113, 213 supplying rf energy to a cathode structure 111, 211. Furthermore each of the systems utilizes a grounded anode 112, 212.

However, as will be noted, in the plasma chemical etching system 100 the wafers 120 are mounted on the grounded anode 112 which extends in a parallel plate configuration with the cathode 111. The connection to the vacuum pump is configured to draw the reactive gasses into the region between the anode 112 and the cathode 111 for confining the reactive gas plasma formed by the rf energy supplied to the cathode 111. In contrast, in the reactive ion etching system 200, the wafers are mounted on the cathode 211 which is shielded from and separated from the anode 212.

The parallel plate plasma system 100 is a relatively high pressure system, operating in the pressure range of 100 millitorr to several torr, and thus involving a substantial flow rate of reactive gasses into the system. In contrast, the reactive ion etching system 200 is operated at low pressures in the range of 1 to 100 millitorr, and thus substantially lower gas flow rates into the chamber are utilized. In the reactive ion etching system 200, activated ion species in the neighborhood of the cathode have high inherent directionality normal to the cathode and the wafers mounted thereon, causing the high anisotropy in the etching characteristics of the system. By using high frequency rf energy at fairly substantial power levels substantial etch rates can be achieved despite the low concentrations of activated species by enhancing the chemical reaction between the activated species and the material to be etched due to the momentum of the ions bombarding exposed material regions on the wafer surface.

Improved directionality of the activated species in the parallel plate plasma system 100 can be achieved by utilizing lower rf frequencies thereby generating electric fields in the region of the anode which enhance ion bombardment of the wafers 120 and directionality of the etch. However, this is achieved at increased risk of metal contamination because the physical bombardment of the anode releases metal particulates.

FIG. 11 illustrates schematically a reactive ion etching system 250 which is available commercially from Applied Materials, Inc. of Santa Clara, Calif. The reactive ion etching system 250 utilizes a cylindrical reaction chamber 260 and a hexagonal cathode 261 conected to an rf supply 263. An exhaust port 26 communicates between the interior of reaction chamber 260 and a vacuum pump. The walls of the reaction chamber 260 and the base plate 262 form the grounded anode of the system. A supply of reactive gas from gas supply 266 is communicated to the interior of the chamber 260 through an entrance port 265 and through a conduit arrangement 268 to a gas distribution ring 267 at the top of the chamber. This type of reactive ion etching system forms the preferred apparatus for carrying out the method of this invention.

The limitations of wet chemical etching and improvements potentially offered by plasma etching systems are illustrated in FIGS. 1-9 of the attached drawings.

FIGS. 1-3 generally illustrate the isotropy of wet chemical etching technology.

FIGS. 4-6 generally illustrate the reduction in etch isotropy which have been achieved in the parallel plate type of plasma etching systems.

FIGS. 7-9 generally illustrate the almost completely anisotropic (directional) etching characteristic which is the goal of reactive ion etching systems (also called reactive sputter etching systems).

FIG. 1 illustrates a semiconductor wafer 10 having a layer of insulating material 15 formed on the top surface thereof with an overlying layer of photoresist 20 which has been patterned to have apertures 21 and 22 therein exposing surface regions 16 and 17 of the insulator layer 15. For purposes of this illustration, it will be assumed that the minimum photolithography feature size is one micron and that the insulator layer 15 and the photoresist layer 20 are both about one micron thick. This somewhat artificial arrangement is used for comparative illustration etching technology and does not necessarily represent actual IC process parameters. It will be noted that the line width in the photoresist layer 20 is greater than one micron, e.g. about two microns. As will be seen, this increased spacing between apertures 21 and 22 and photoresist layer 20 is required to take into account the isotropy of the wet chemical etch operation. While the example given here is somewhat artificial, it is illustrative of the inability of wet chemical etching technology to take advantage of the minimum photolithography feature size available with today's current high resolution lithography systems.

Thus as shown in FIG. 2, the step of wet chemical etching the insulator layer 15 using the patterned photoresist layer as an etchant mask, results in general replication of the photoresist mask pattern into the insulator layer 15 but with substantially enlarged apertures 18 and 19. This is due to the isotropic attack of the wet chemical etchant on the insulator layer 15 and the general need to perform at least some overetch to be sure to clear the surface of the semiconductor wafer 10 in the exposed regions 11 and 12. In general, wet chemical etching will produce an enlargement in the aperture size at least equal to the thickness of the layer being etched with overetching producing an even greater enlargement of the replicated aperture size.

The structure shown in FIG. 3 where doped regions 13 and 14 have been formed in regions of substrate 10 generally corresponding to the exposed surface regions 11 and 12 depicted in FIG. 2, is produced by relatively shallow ion implantation of conductivity modifying impurities into the surface regions of substrate 10.

FIGS. 4 through 6 illustrate that, due to the improved directional etching capability of some parallel plate plasma reactive etching systems, improvements in device density can be achieved by allowing adjacent photoresist apertures to be located closer together. As illustrated in FIG. 4, the apertures 41 and 42 in photoresist layer 40 are separated by a more narrow line width of photoresist material.

FIG. 5 illustrates the reduction in isotropy of the parallel plate plasma etching of the insulator layer 35 to create the apertures 38 and 39. Although parallel plate plasma etchers still produce some undercutting of the insulator layer in the surface regions underlying the photoresist aperture, this undercutting is substantially less than that produced by the wet chemical etching system as depicted in FIG. 2. Overetch conditions to ensure clearing the material from the substrate regions 31 and 32 to be exposed in the etching process results in further enlargement of the effective aperture size at the interface between the insulator layer 35 and the substrate 30.

As depicted in FIG. 6, the end result of the parallel plate plasma etching of the insulator 35 is that implanted regions 33 and 34 occupy a substantially smaller area of the wafer 30 than doped regions 13 and 14 in FIG. 3. This reduction in chip "real estate" utilized provides higher device density and thus higher levels of device integration in IC fabrication.

FIGS. 7-9 illustrate the further improvement in replicating the photoresist pattern in photoresist layer 60 into the insulator layer 55 which is the goal of highly directional reactive ion etching systems currently available on the market, for example the AME 8100 series of plasma etching systems available from Applied Materials, Inc., of Santa Clara, Calif. As shown in FIG. 8, replication of the photoresist apertures 61 and 62 in photoresist layer 60 is accomplished with very high resolution in that apertures 58 and 59 in insulator layer 55 have almost vertical side walls. The size of the exposed regions 51 and 52 of substrate 50 correspond almost identically with the sizes of the photoresist apertures 61 and 62. The area of the substrate 50 occupied by the adjacent doped regions 53 and 54 is substantially less than the corresponding area of doped regions 33 and 34 in FIG. 6 and dramatically less than the doped regions 13 and 14 in FIG. 3. Thus, higher device density and greater levels of device integration should be achievable with reactive ion etching. Full realization of the capabilities of ion assisted plasma etching will be imperative for fabrication of very large scale integrated circuit devices.

While FIGS. 4-6 and FIGS. 7-9 generally illustrate the promise of substantial improvement in replicating the photoresist pattern into underlying layers of material which should be achievable using parallel plate plasma and reactive ion etching systems, a number of problems have been encountered in the practical application of this technology to IC fabrication especially in high volume production environments. In particular, severe problems have been encountered in applying dry etching technology to the patterning of silicon oxide and silicon nitride layers which are used in various ways in the processing of semiconductor wafers into integrated circuit chips.

One of the applications of such patterned layers is illustrated in FIGS. 6-9, i.e. as an ion implantation or diffusion mask to define isolated regions of a semiconductor substrate to be doped with conductivity modifying impurities. For this application of dry etching technology, it is important to achieve simultaneously a number of etching system characteristics. Both high etch anisotropy and high etch selectivity for the oxide or nitride layer relative to the overlying patterned photoresist layer are required for high resolution replication of the photoresist mask pattern into the underlying oxide or nitride layer. High uniformity of etching across the wafer with uniform etch rate independent of feature size is important for high fabrication yield especially in situations where the photolithography pattern feature size may vary from a one micron feature to a 10 or 20 micron feature at the same mask level because different sizes of transistor devices are being fabricated on the same chip. In addition, high etch selectivity for the underlying silicon substrate is necessary to avoid substrate removal which could adversely affect the operation of the transistors being fabricated.

FIG. 12 illustrates another application of dry etching of oxide and nitride layers, in this case the patterning of a thin gate insulator layer 331 utilizing an overlying region 332 of doped or undoped polysilicon as an etching mask as part of the process for fabricating self-aligned silicon gate CISFET devices. In this fabrication technology, the gate insulator 331 is generally a thin, thermally grown silicon dioxide layer, but in some technologies it may be a composite layer of grown silicon dioxide and deposited silicon nitride. Steps leading up to the wafer topology shown in FIG. 12 are well known in the CISFET processing art, and briefly, involve first forming the gate insulator layer 331 on the wafer followed by deposition of a uniform layer of polysilicon, and then patterning of the polysilicon layer using photolithography and etching to create the polysilicon gate electrode region 332. This gate electrode region 332 is then utilized as an etching mask for dry etching the gate insulator layer 331 down to the surface of the silicon substrate 320, after which the doped regions 321 and 322 shown in dashed lines may be created by ion implantation or furnace diffusion operations. In this dry etching application, a highly anisotropic etch characteristic is required to avoid undercutting the gate insulator layer 331 at the edge of the silicon gate region 332. Futhermore, high etch selectivity for the gate insulator 331 with respect to both the overlying polysilicon region 332 and the silicon substrate is required to avoid substantial changes in the dimensions of the polysilicon gate region 332 and to avoid removal of the surface of the silicon substrate near the completion of the etching operation. High uniformity of etching across the wafer with uniform etch rate independent of feature size is important because substantial feature size variations are typical in this processing technology and minimization of overetch requirements is important to avoid substrate removal.

FIG. 13 illustrates another application of dry etching of silicon dioxide layers. In this case the patterning of a chemical vapor deposition (CVD) oxide layer 313 is required to provide contact windows 314 and 315 to respective doped substrate region 311 and doped polysilicon region 312. Here photoresist patterning of the CVD oxide layer 313 is utilized. In this case, isotropic etching of the silicon dioxide layer is preferred to produce sloped contact window edge profiles to reduce the steepness of the angle of the step in the metal layer 316 which is formed over the oxide layer 313 after the windows 314 and 315 have been formed. For application, high etch selectivity with respect to overlying photoresist is not important, but high etch selectivity for the underlying silicon and polysilicon layers is important especially since substantial overetch is required to assure clearing the contact window of oxide material for purposes of assuring low resistance contact of the subsequently formed metal layer on the exposed silicon and polysilicon surfaces. Overetching may also be required due to layer thickness variation and the substantial variations in wafer topology at this stage of the process.

FIGS. 14 and 15 illustrate another application of dry etching of silicon oxide layers. The particular application here involves a dielectric device isolation, wafer planarization technique described in a paper by H. G. Pogge entitled "Advanced Device Isolation For Very Large Scale Integration" presented at the American Institute of Chemical Engineers 1981 National Meeting on Aug. 18, 1981. In this application, a layer of CVD oxide 360 has been formed over the wafer 350 after a deep groove 351 has been etched anisotropically into the wafer surface, followed by a thermal oxidation to form a thin silicon dioxide surface layer 355. Because of the depth of the groove 351 a recess or cusp 362 exists in the deposited oxide layer 360. A spin-on polymer layer 365, e.g., photoresist or polyimide is then utilized to planarize the top surface of the wafer. Thereafter, the polymer layer 365 and the deposited oxide layer 360 are etched back to the surface of the semiconductor wafer creating the topology shown in FIG. 15.

For this etch back operation, it is important to have highly anisotropic etching with substantially no etch selectivity between the polymer layer 365 and the oxide layer 360 so that a uniform rate of etchback will be produced especially when the etch back has reached the level marked A—A in FIG. 14 so that the cusp filling region 366 of the polymer layer 365 is etched at the same rate as the surface regions of the deposited oxide layer 360. If this requirement is not substantially met, the final topography will not have the planar surface shown in FIG. 15. If the polymer etches at a faster rate than the oxide, the polymer region 366 will be etched back faster than the surface regions of the silicon dioxide layer 360, replicating the cusp in the wafer surface after etchback shown by the dashed line 363 in FIG. 15.

In addition to the above discussed, varying requirements or demands placed on the dry etching technology in etching of silicon oxide and nitride layers, it is extremely important for the process technology and accompanying plasma chemistry to minimize metallic or other particle contamination and to achieve reproducibility of etch results from batch-to-batch. In addition the required characteristics need to be achieved at high wafer throughput, thus requiring substantial etch rates. Finally, the etching process technology and accompanying plasma chemistry should have a minimum deleterious effect on the etching system and the maintenance of that system.

While it has been known in the art for several years that certain activated species of various fluorocarbon gasses will etch silicon dioxide and silicon nitride at substantial rates, a number of problems have been encountered in applying fluorocarbon gas plasma chemistry to the etching of silicon nitride and oxide layers. The more serious of the problems that have been encountered are the tendency for the activated ion species to form nonvolatile fluorocarbon polymers which tend to deposit on the surfaces of the wafers being etched and on other surfaces of the reactor. Such polymer formation tends to adversely affect the rate of etching of silicon oxide and nitride layers, to cause problems in reproducibility of etching results, to generate particulate contamination which can produce device defects, to require increases in plasma energy requirements which can lower etch rate differentials between photoresist layers and silicon oxide and nitride layers to be patterned, and to increase system down time for removal of deposited polymer films on reactor surfaces.

The prior art has developed fluorocarbon plasma chemistry systems which have high etch selectivity for the silicon oxide and silicon nitride layers relative to polymer photoresist and silicon. However, thus far, there have been no developments of a plasma chemistry system and accompanying plasma etching process which achieve such etch selectivity along with low polymer formation and also have the capability of meeting all of the other requirements for use of dry etching in the various IC fabrication requirements outlined above.

Accordingly, it is a principal object of this invention to provide an improved process for plasma etching of inorganic insulating materials having silicon as their principal metallic constituent.

It is a further object of this invention to provide improved reactive plasma gas chemistry systems for use in processes for plasma etching of inorganic insulating materials having silicon as their principal metallic constituent.

In accordance with one aspect of this invention, the abovestated objects are achieved in a method for etching a layer of inorganic insulating material formed on a semiconductor wafer and containing silicon as the principal metallic element therein which generally includes the following steps. First, the wafer on which the layer of insulating material is formed is disposed on one of a pair of electrode structures in a closed reaction chamber. The next step is to communicate into the chamber a reactive gas mixture comprising principally a fluorocarbon gas doped with a preselected quantity of carbon dioxide; radio frequency electrical energy is supplied to one of the electrode structures to create a plasma of the reactive gas mixture for chemically attacking the insulating material.

For reactive ion etching, this process is preferably carried out by disposing the wafer on the cathode within the closed chamber. Fluorocarbon gas is doped with carbon dioxide in the range of about 1 to 50 percent by volume and is supplied to the chamber. The actal doping level selected is determined by the particular requirements of the etching system in the IC fabrication operation to which it is applied. The chamber of the reactive ion etching system is preferably maintained at a pressure in the range of about 20 to 100 millitorr and the rf electrical energy is preferably supplied at a power level which creates a power density in the range of about 0.10 to 0.30 watts/cm$^2$. The reactive gas mixture is preferably supplied at a total flow rate which produces a residence time of activated species in the range of about 1–60 seconds.

For adapting the general process of this invention to etching substantial vertical side wall patterns into a layer of the insulating material in the presence of an overlying patterned layer of organic photoresist material, thereby to expose corresponding regions of one or more layers of silicon on the wafer, the preferred fluorocarbon gas to be utilized in the process is $CHF_3$ and the preferred carbon dioxide doping level is in the range of about 5 to 15 percent by volume. Furthermore, the chamber is maintained preferably at a pressure in the range of 40 to 80 millitorr. The rf electrical energy is preferably supplied at a power level which creates a power density in the range of about 0.18 to 0.26 watts/cm$^2$. The reactive gas mixture is preferably supplied at a total flow rate which produces a residence time of activated species in the range of about 6–30 seconds.

While highly anisotropic etching of oxide and nitride layers can be achieved utilizing these process parameters and simultaneously good etch selectivity with respect to photoresist and silicon is realized, it has been found preferable to optimize the etching process parameters by utilizing $CHF_3$ with carbon dioxide doping at a level of about 10 percent. The optimum pressure in the chamber is about 70 millitorr and the optimum power density is about 0.22 watts/cm$^2$. The optimum residence time is about 20 seconds.

To adapt the general method of this invention for either etching back a composite layer of inorganic insulating material and an organic insulating material or for etching highly sloped side wall patterns into the layer of inorganic insulating material in the presence of an overlying patterned layer of organic photoresist material, it is preferable to maintain carbon dioxide doping in the reactive gas mixture in the range of about 30 to 50 percent by volume.

The principal advantage of the plasma gas chemistry system and method of this invention is that the use of carbon dioxide as a dopant for the fluorocarbon etching gas substantially reduces the rate of polymer formation on reactor surfaces, eliminates the adverse effect of polymer formation on etching of the insulator materials while also simultaneously achieving relatively high etch rates, high selectivity of etching of silicon oxide and silicon nitride over silicon and sufficient selectivity over photoresist. Furthermore, by controlling the doping level of the carbon dioxide, the etch aperture profile can be controlled from vertical to a substantial angle which is especially useful in patterning silicon dioxide layers before metal deposition to avoid yield loss due to metal fracturing which can occur in a metal layer deposited over oxide aperture edges which are too sharp and steep. Furthermore, the gas chemistry system and method of this invention achieve highly uniform etch rate across the surface of the wafer and highly uniform etch rates which are independent of feature size.

Other objects, features, and advantages of this invention will be apparent from a consideration of the following more detailed description in conjunction with the accompanying drawings.

FIGS. 1–3 illustrate the isotropic etch characteristics of wet chemical etchants.

FIGS. 4–6 illustrate improvements in etch anisotropy achievable in parallel plate plasma reactors.

FIGS. 7–9 illustrate the vertical etching characteristics of ion assisted (reactive ion) etching systems.

FIG. 10 is a schematic illustration of a parallel plate plasma reactor system.

FIG. 11A is schematic illustration of a parallel plate reactive ion etching system.

FIG. 11B is a schematic illustration of reactive ion etching system employing a hexagonal cathode structure which is the preferable apparatus for carrying out the method of this invention.

FIG. 12 is a fragmented section view illustrating the partial topology of a CISFET device showing one application for reactive ion etching.

FIG. 13 is a fragmented section view of a portion of the topology of a CISFET device showing another application of dry etching technology.

FIGS. 14 and 15 are fragmented section views of a portion of a semiconductor wafer illustrating the application of plasma etching to a method for forming planar oxide isolation wells in a semiconductor substrate.

FIGS. 16-18 are graphs useful in illustrating the performance of the dry etching method and reactive plasma gas chemistry system in accordance with this invention.

FIGS. 1-15 have been generally described in connection with the introductory section of this specification and need not be discussed again in detail here. At appropriate places, reference back to these figures will be made for purposes of illustration.

The dry etching methodology and the plasma gas chemistry of this invention are based on the discovery that relatively small percentage amounts of carbon dioxide added as a dopant gas to fluorocarbon gas compositions which are known to have substantial etch rate selectivity for silicon oxide and silicon nitride over silicon greatly reduces the rate of polymer formation in the activated gas species without drastically affecting the etch selectivity for silicon oxide and silicon nitride relative to silicon. Moreover, it was also discovered that, while the addition of carbon dioxide as a dopant to the reactive gas does result in activated oxygen species in the plasma and thus increases the etch rate for photoresist, acceptable etch selectivity for silicon oxide and silicon nitride over photoresist can be maintained when required.

FIG. 16 shows the polymer deposition rate (in Angstroms per minute) on the anode of a reactive ion etching system as a function of the percentage volume concentration of dopant gasses $O_2$ and $CO_2$. Superimposed on the graph of polymer deposition rate versus dopant concentration is a graph of etch selectivity for thermal oxide over single crystal silicon for the same two dopant gasses. These results are for $CHF_3$ as the primary etchant gas with the gas mixture supplied at 100 SCCM, while maintaining reactor pressure at 80 millitorr, and applying rf energy at a power level of 1400 watts. An AME 8100 Etching System as depicted schematically in FIG. 11B was used.

It has been known for some time that the addition of oxygen to fluorocarbon gasses will reduce polymer formation. However, addition of oxygen also produces an unacceptable reduction in etch selectivity for silicon oxide over silicon. Thus, as shown in FIG. 16 although about five percent by volume of oxygen in $CHF_3$ reduces polymer formation on the anode by fifty percent, it also reduces etch selectivity for silicon oxide over silicon by about seventy-five percent. In contrast, the addition of eight to ten percent by volume of carbon dioxide to $CHF_3$ reduces polymer formation by almost fifty percent but etch selectivity for silicon oxide over silicon is only reduced by about fifteen or twenty percent. The reduction in etch rate selectivity of silicon oxide over photoresist was also in the range of fifteen to twenty-five percent at this $CO_2$ dopant concentration.

Furthermore, it has been discovered that, because the addition of $CO_2$ dopant gas to the $CHF_3$ reactive gas actually increases silicon oxide etch rates, acceptable etch rates of silicon dioxide can be achieved at sufficiently low rf power settings that improved photoresist integrity is achieved. This makes it possible to etch silicon dioxide with an overlying photoresist mask without postbaking the photoresist mask after it has been exposed and developed. Elimination of this postbaking step which is otherwise required for good resist stability is especially important for high density IC devices since the high temperature postbake tends to cause flow of the resist and corresponding changes in resist pattern dimensions before the etching operation is carried out. Elimination of the high temperature postbake step also constitutes a savings in wafer processing time and thus achieves greater wafer throughput in an IC fabrication operation.

FIG. 17 illustrates the etch rates for phosphosilicate glass (PSG) having an 8 weight percent doping of phosphorus, thermal silicon dioxide, positive resist and silicon at various rf power settings in the AME 8100 Series Plasma Etching System referred to above. The system was operated at a total flow rate of 100 SCCM using 10% $CO_2$ by volume in $CHF_3$. The chamber pressure was maintained at 70 millitorr. This graph shows that the etch rates for thermal oxide, doped glass (PSG) positive photoresist and silicon all show increases for increases in rf power setting. FIG. 17 thus illustrates that useful etch rate differentials for thermal oxides and deposited oxides with respect to both photoresist and single crystal silicon can be achieved over a broad range of rf power settings.

FIG. 18 illustrates the impact on etch rates of thermal oxides and doped oxides on increases in reactor pressure. This graph illustrates that useful etch rate selectivity can be maintained for oxide layers over photoresist and silicon over a wide range of reactor pressures. This data was taken on an AME 8100 Series Plasma Etching System using a total flow rate of 80 SCCM, a power setting of 1150 watts and 10% $CO_2$ by volume in $CHF_3$. Accordingly, it is seen that reactor pressure can be kept at a relatively low setting to assist in minimizing polymer film formation in the activated gas species and thus reducing polymer formation on the walls of the reactor.

Other experiments have been performed which demonstrate that silicon oxide etch rates actually increase with increased percentages by volume of the dopant carbon dioxide gas. Other experiments show that total reactive gas flow into the reaction chamber does not dramatically affect the silicon dioxide etch rate although etch selectivity over silicon is somewhat increased at higher gas flow rates. Furthermore total gas flow does not have any substantial effect on polymer deposition rates.

To develop the data shown in the graphs of FIGS. 16-18 and to characterize the fluorocarbon $CO_2$ plasma technology, experiments using various $CO_2$ dopant concentrations, reactor pressure settings, rf power settings, and reactive gas flow rates were performed. Out of these experiments, it was determined that useful results could be achieved in at least some of the silicon dioxide etching applications described above over the ranges of operating parameters shown in Table I below.

TABLE I

| Operating Parameter | Range |
|---|---|
| RF Power | 500–1500 watts |
| Reactor Chamber Pressure | 20–150 millitorr |
| Total Flow Rate | 20–200 SCCM |
| Volume % $CO_2$ | 1–50 percent |

These ranges of operating parameters are for the AME 8100 System. The rf Power range corresponds to power densities in the range of about 0.10 to 0.30 watts/cm$^2$. The pressure and flow rate ranges correspond to residence times for activated species in the range of about 1–60 seconds. The residence time is a function of chamber volume, chamber pressure and total gas flow rate and can be calculated using the following formula:

$$\text{Residence Time (Min)} = \frac{\text{Volume (Liters)} \times \text{Pressure (Torr)}}{\text{Flow (Liters/Min)} \times 760 \text{ (Torr)}}$$

It has also been determined that addition of other dopant gasses such as nitrogen, oxygen, hydrogen and various other gasses in quantities less than about five percent will not diminish the advantages which are achieved by $CO_2$ dopants in the reactive gas mixture. While it is preferable to use $CHF_3$ as the principal reactive gas because of its relatively low ionization potential, other fluorocarbons which are deficient in fluorine and thus have substantial etch rate differentials for silicon dioxide over silicon, such as $C_2F_6$ and $C_3F_8$ could also be used with appropriate doping of $CO_2$. In addition, $CF_4$ which by itself etches silicon at a faster rate than silicon dioxide could be utilized with $CO_2$ doping provided sufficient hydrogen is also added to scavenge free fluorine radicals and increase the etch rate for silicon dioxide to a value substantially greater than that for silicon.

The experimental investigation carried out in connection with this invention utilized various oxide films of one micron thickness on silicon substrates with patterned layers of HPR-204 photoresist overlying the oxide films. The oxide films included thermally grown silicon dioxide and phosphosilicate glass deposited on the silicon wafer surface. The phosphosilicate glass used constituted both undensified glass and glass layers densified in steam at 930° C. for thirty minutes. In addition various phosphorus doping levels of the deposited glass were utilized. Etch rate determinations were made using three different instruments: a Tencor Alpha-Step surface profiler, and a Nanometrics Nano-Spec, and a laser interferometer. The silicon etch rates were determined by overetching wafers into the silicon base layer, using laser interferometry to determine the end point of oxide etching. A laser interferometer operating at a wavelength of 632.8 nanometers was used to monitor etch rates of various oxide films as a function of the process parameters of power and pressure.

As a result of the investigations made in connection with this invention, it has been determined that the best results for patterned etching of silicon oxides on silicon substrates using overlying patterned resist layers were achieved by utilizing the ranges of process parameters set forth in Table II below (R.F. Power, Total Flow Rate and Pressure being settings for the AME 8100 System).

TABLE II

| Operating Parameter | Range |
| --- | --- |
| RF Power | 950–1350 watts |
| Power Density | 0.18–0.26 watts/cm$^2$ |
| Reactor Chamber Pressure | 40–80 millitorr |
| Total Gas Flow Rate | 40–100 SCCM |
| Residence Time | 6–30 seconds |
| Volume % $CO_2$ | 5–15 percent |

It was also determined that the best overall etch results in pattern etching of oxide layers over silicon with overlying resist were achieved in an AME 8100 System using an rf power setting of about 1150 watts (equal to about 0.22 watts/cm$^2$), a reactor chamber pressure of about 70 millitorr, a total gas flow rate of about 83 SCCM (giving a residence time of about 20 seconds) and a 10 volume percent $CO_2$ dopant concentration in the $CHF_3$ gas. However, as previously indicated variations of 10 to 20 percent in some of these parameters and variations of 20 to 40 percent and other parameters does not substantially affect the overall etch results in many applications. Table III below gives typical etch results achieved using the optimum conditions stated above in the AME 8100 System.

TABLE III

| Layer Material | Etch Rate (A/min./) | Selectivity Over Silicon | Selectivity Over Resist |
| --- | --- | --- | --- |
| Thermal Oxide | 500 | 17:1 | 7:1 |
| Phosphosilicate Glass (4 wt % P) undensified | 750 | 25:1 | 11:1 |
| Phosphosilicate Glass (8 wt % P) densified | 1000 | 33:1 | 14:1 |
| Phosphosilicate Glass (8 wt % P) undensified | 1400 | 47:1 | 20:1 |

While the investigations carried out in connection with this invention primarily involved the etching of silicon oxide layers, generally comparable results would be achieved on deposited silicon nitride layers with generally a forty percent reduction in etch performance. However, even with lower etch rates and etch selectivities for silicon nitride, the plasma etching method and gas chemistry of this invention can be usefully applied to the patterning of silicon nitride layers on semiconductor substrates.

The plasma etching method and reactive gas chemistry of this invention can also be applied with advantage in parallel plate plasma reactors of the type shown in FIG. 11A. A single wafer parallel plate reactive ion etching system was operated using a reactive gas mixture comprising about 17 percent by weight of $CO_2$ in $CHF_3$. The chamber was operated at a pressure of about 30 millitorr. The total gas flow rate was 30 SCCM. The reactor was operated at 300 watts of rf power giving a power density on the eight inch diameter cathode of about 0.9 watts/cm$^2$. Using these process conditions, an etch rate for thermal oxide of about 600 Angstroms per minute was observed. The etch selectivity for thermal oxide over single crystal silicon was about 15:1 and the etch selectivity for thermal oxide over positive photoresist was about 6:1. When the same single wafer parallel plate system was operated without the $CO_2$ dopant gas in the $CHF_3$, an etch rate of only 400 Angstroms per minute was observed because of polymer formation on the wafer.

Utilizing the reactive gas chemistry of this invention and a reactive ion etching system such as the AME 8100 Series System available from Applied Materials, it is possible to achieve controlled profile etching, i.e. the side wall profile of the etched aperture in the oxide or nitride layer can be varied from an almost completely vertical edge to a substantially tapered wall. By maintaining the $CO_2$ dopant concentration at the level of 5–15 volume percent, etch rates of the resist are low and the resulting edge profile of the aperture etched in the oxide layer is vertical. This has been substantiated by scanning electron microscope studies of actual etching results on semiconductor wafers. Furthermore, such vertical edge profiles are achieved for both thermal oxides and phophosilicate glasses using resist masks which have not been subjected to a high temperature postbaking process.

In some cases, as illustrated in FIG. 13 for contact window etching, it is preferred to have a tapered wall so that complete coverage by the metal film over the step in the insulating layer can be achieved. When a metal film is deposited over a contact window having a vertical side wall, it is very difficult to maintain continuity between the region of the metal film in the contact window and the region overlying the oxide layer, because fractures in the metal film can easily occur at the sharp edge of the contact window. A reduction in the steepness of the step profile can be accomplished using a high temperature reflow of the doped phosphosilicate glass after the contact window has been etched. However, this technique is often undesirable, and definitely cannot be used when the oxide is used as an insulation between two layers of aluminum in a multilevel conductor interconnect system.

In accordance with one aspect of this invention, a tapered edge wall profile of a contact window is achieved by reducing the oxide to resist etch rate selectivity and this is accomplished by adjustment of the $CO_2$ doping level in the reactive gas mixture. Tapering of the side walls can be achieved up to an angle of about sixty degrees by increasing the $CO_2$ volume percent doping concentration to fifty percent. Other profiles can be achieved between vertical and sixty degrees by using intermediate concentrations of $CO_2$ dopant gas. One of the additional benefits of this invention is that, although the window edge profile angle can be controlled by $CO_2$ dopant levels, critical device dimensions are still maintained. Scanning electron microscope studies of contact openings etched in oxide layers utilizing the technique of this invention have shown that the bottom of the contact opening is of substantially identical size for both vertical and tapered edge profiles.

The same type of adjustment in etch rate selectivity between photoresist or organic polymer layers and silicon dioxide enables the reactive plasma gas chemistry and method of this invention to be usefully applied in the oxide well isolation, wafer planarization method depicted in FIGS. 14 and 15 of the drawings and described in the above-referenced Pogge paper. The $CO_2$ reactive gas doping concentration can readily be adjusted to equalize the etch rates of a deposited oxide and an organic photoresist or polyimide layer. Another important advantage of this invention, especially as applied to etch-back applications as depicted in FIGS. 14 and 15 and in semiconductor process steps where the oxide film is only thinned rather than completely etched away, is etch rate uniformity.

The oxide etch rate uniformity achieved using the plasma etching method and reactive gas chemistry of this invention was investigated by using an optical technique employing an IBM film thickness analyzer. Unpatterned thermal oxide films approximately one micron thick were measured at 118 different sites on each of a number of silicon wafers. These wafers were then etched under the optimum oxide etching conditions set forth above for a time period which would remove about 8000 Angstroms of oxide, leaving approximately 2000 Angstroms remaining on the wafer. Then the remaining oxide films were measured for film thickness at the same 118 locations. The etch rate at each site was then calculated using the two sets of thickness measurements. The variations in etch rate were determined to be less than $\pm 5\%$ ($2\sigma$) in all cases. This demonstrates that the etch rate uniformity using the etching process and gas chemistry of this invention is within the requirements for most film thinning process applications.

Another critical parameter in characterizing etch performance, and one of utmost importance in pattern replication, is line width uniformity. The performance of the etching method and reactive gas chemistry of this invention with respect to this parameter investigated using a specially designed test pattern that contains a number of electrically sensitive line width structures consisting of a van de Pauw resistor and two or more bridge-type resistors. These structures are etched into the oxide film as openings to the silicon substrate followed by doping of the exposed silicon substrate by ion implantation. The resistor structures are then electrically probed in each of 118 locations over the wafer and the width of the opening is determined using an automatic DC parametric test system controlled by a minicomputer. The 118 data points on each wafer are then used to generate a line width contour map.

Before the investigations in connection with this invention, wafers having both 6000 Angstroms of thermal oxide and 6000 Angstroms of phosphorus doped glass were utilized. A 1.2 micron HPR-204 photoresist film was utilized and the openings in this photoresist film for the test structure of interest were measured at 5 points on every wafer in each batch by a Vickers Shearing microscope to determine the mean nominal opening within standard deviation for each batch. These values were determined to be $3.28 \pm 0.19$ and $3.16 \pm 0.2$ microns for the thermal oxide and phosphorus doped glass layers, respectively. The wafers were then etched to end point plus a ten percent or fifty percent over etch in four runs of four wafers each. The mean opening width in standard deviation for each wafer was determined by the described technique and the results are given in Table IV below.

Of primary interest in the results of the investigation is the uniformity of the etch opening. The value reported in Table IV is the standard deviation due to both the photolithography and the etch process. In every case, the standard deviation is less than or equal to that of the photolithography alone which indicates a high degree of pattern replication fidelity in the plasma etching process of this invention.

TABLE IV

| Etched Layer: 6000 Å Thermal Oxide | | |
|---|---|---|
| Degree of Etch | Wafer No. | Mean Opening Width $\pm 2\sigma$ (Microns) |
| Unetched | Mean of 25 | $3.28 \pm 0.19$ |
| 10% overetch | 8 | $3.26 \pm 0.20$ |
|  | 9 | $3.37 \pm 0.18$ |
|  | 10 | $3.33 \pm 0.17$ |
|  | 18 | $3.36 \pm 0.18$ |
| 50% overetch | 13 | $3.36 \pm 0.16$ |
|  | 14 | $3.34 \pm 0.14$ |
|  | 15 | $3.31 \pm 0.18$ |
|  | 17 | $3.27 \pm 0.19$ |
| Etched layer: 6000 Å PSG (8 wt % Phosphorous) | | |
| Degree of Etch | Wafer No. | Mean Opening Width $\pm 2$ (Microns) |
| Unetched | Mean of 25 | $3.16 \pm 0.20$ |
| 10% overetch | 13 | $3.22 \pm 0.18$ |
|  | 14 | $3.13 \pm 0.15$ |
|  | 16 | $3.18 \pm 0.19$ |
|  | 17 | $3.11 \pm 0.13$ |
| 50% overetch | 8 | $3.22 \pm 0.18$ |
|  | 9 | $3.24 \pm 0.19$ |
|  | 10 | $3.17 \pm 0.20$ |
|  | 12 | $3.15 \pm 0.14$ |

The results also show that the mean opening widths are nearly equal in both the ten percent and fifty percent overetch process runs. This indicates that substantially complete etch anisotropy with minimal attack of the photoresist mask was achieved using the process parameters and gas chemistry of this invention.

In addition to the high degree of etch rate uniformity and line width achieved utilizing the plasma etching process and gas chemistry of this invention, it has also been demonstrated that this invention enables the pattern replication of photolithography features of widely varying sizes at the substantial etch rate uniformity. In other words, it has been demonstrated that a one micron feature size is cleared from the wafer at the same rate as ten to twenty micron features. This is important since it is undesirable to expose large areas of the wafer corresponding to large photolithography features before small areas have cleared. In other etching technologies it is common to encounter a much lower etch rate (e.g. thirty percent less) in the smaller features because of the larger aspect ratio between the small feature size and the oxide film thickness. This improvement is achievable only in the use of this invention in a reactive ion etching system since feature independent etch rate uniformity cannot be achieved in a high pressure parallel plate plasma system. In other respects, the major advantages of this invention are achieved both in parallel plate plasma reactors operating at relatively higher pressures and lower frequencies and in reactive ion etching systems generally operating at lower pressures and higher frequencies. Of course, the degree of performance advantage is substantially greater in the reactive ion etching system.

From the above description, it should be apparent that the Plasma etching method and the reactive gas chemistry system of this invention provides a number of advantages over prior art systems. The substantial reduction in polymer formation results in higher etch rates, less system down time for cleaning and reduced particulate contamination. This invention permits etching to be performed at higher pressures with lower power densities to achieve less resist damage. This enables the invention to be applied with positive photoresists without requiring a hard, high temperature postbake after developing the pattern written into the photoresist layer. This is an important advantage in avoiding any possible change in resist aperture dimension due to flow of the resist which tends to exist during a high temperature bake. The system and gas chemistry of this invention provide reproducible high etching uniformity and resolution, easily achieving one micron windows in one micron thick oxide layers.

As those familiar with this art are well aware, the physical and chemical mechanisms involved in plasma etching are not well or completely understood despite the extensive investigative research which has been conducted in this area. Accordingly, the reasons for the performance achieved using carbon dioxide dopant in fluorocarbon gasses in accordance with this invention are also not well understood. However, reduction in polymer formation is probably achieved by providing free oxygen radicals (from disassociation of $CO_2$) which can react with polymer formers to produce water vapor and either carbon monoxide or carbon dioxide, both of which are volatile compounds and are swept out of the system. In addition, free carbon radicals may react with free fluorine radicals to produce volatile fluorocarbons such as $CF_4$ which are pumped out of the system and reduce the availability of carbon and fluorine radicals to form nonvolatile polymeric compounds. While the reasons for the improvements generated by this invention are not well understood, the improvements have been thoroughly demonstrated and validated in the development work generally reported above.

While this invention has been discussed above in connection with various preferred and alternative embodiments of the plasma etching system and reactive gas chemistry, it should be understood that persons of skill in this art could make numerous modifications therein without departing from the scope of this invention as claimed in the following claims.

What is claimed is:

1. In a method for etching a layer of inorganic insulating material formed on a semiconductor wafer and containing silicon as the principal metallic element, the steps of:

disposing said wafer on one of a pair of electrode structures in a closed chamber;

communicating into said chamber a reactive gas mixture comprising principally a fluorocarbon gas doped with a preselected quantity of carbon dioxide; and supplying radio frequency electrical energy to one of said electrode structures to create a plasma of said reactive gas mixture for chemically attacking said insulating material.

2. The method of claim 1, wherein said wafer is disposed on the cathode within the closed chamber of a reactive ion etching system; and said fluorocarbon gas is doped with carbon dioxide in the range of about 1–50 percent by volume.

3. The method of claim 2, wherein said chamber is maintained at a pressure in the range of about 20–100 millitorr; and said radio frequency electrical energy is supplied at a power level which creates a power density in the range of about 0.10–0.30 watts/cm$^2$.

4. The method of claim 3, wherein said reactive gas mixture is supplied to said chamber at a flow rate sufficient to provide a residence time of said reactive gas mixture in the range of 1–60 seconds.

5. The method of claim 2 adapted for etching substantially vertical sidewall patterns into said layer of insulating material in the presence of an overlying patterned layer of organic photoresist material to expose corresponding regions of a layer of silicon on said wafer, wherein said fluorocarbon gas is $CHF_3$ and said carbon dioxide doping is in the range of about 8–12 percent by volume; said chamber is maintained at a pressure in the range of about 40–90 millitorr; said gas mixture is supplied to said chamber at a flow rate which produces a residence time of activated species in the range of about 6–30 seconds; and said radio frequency electrical energy is supplied at a power level which creates a power density in the range of about 0.18–0.26 watts/cm$^2$.

6. The method of claim 2 adapted for either etching back a composite layer of said inorganic insulating material and an organic insulating material or for etching slanted side wall patterns into said layer of organic insulating material in the presence of an overlying patterned layer of organic photoresist material, wherein said carbon dioxide doping in said reactive gas mixture is in the range of about 30–50 percent by volume.

7. In a method for forming a pattern of apertures with substantially straight side walls in a layer of inorganic insulating material formed on a semiconductor wafer and comprising silicon as the principal metallic element therein, the steps of:

forming a layer of photoresist on said insulating material layer;
exposing preselected regions of said photoresist layer to preselected electromagnetic radiation to write a mask pattern therein;
developing said written photoresist layer with a preselected developing solution;
disposing said sustrate on the cathode structure of a reactive ion etching chamber without postbaking said developed photoresist layer; and
simultaneously supplying radio frequency electrical energy to said cathode structure at a power level which creates a power density in the range of about 0.18–0.26 watts/cm$^2$ and supplying to said chamber a reactive gas mixture comprising principally $CHF_3$ doped with carbon dioxide in the range of 5–15 percent by volume while maintaining said chamber at a pressure in the range of about 40–80 millitorr, said reactive gas mixture being supplied at a total gas flow rate which produces a residence time of activated species in the range of 6–30 seconds.

8. In a method for forming a pattern of apertures with substantially sloping side walls in a layer of inorganic insulating material formed on a semiconductor wafer and comprising silicon as the principal metallic element therein, the steps of:
forming a layer of photoresist on said insulating material layer; exposing preselected regions of said photoresist layer to preselected electromagnetic radiation to write a mask pattern therein;
developing said written photoresist layer with a preselected developing solution to produce apertures therein corresponding to said written mask pattern;
disposing said substrate on the cathode structure of a reactive ion etching chamber without postbaking said developed photoresist layer; and
simultaneously applying radio frequency electrical energy to said cathode structure at a power level which creates a power density in the range of about 0.18–0.26 watts/cm$^2$ and supplying to said chamber a reactive gas mixture comprising principally a fluorocarbon gas heavily doped with one or more oxygen plasma forming gas constituents, the concentration of said oxygen plasma forming gas being selected at a value in the range of 20–50 percent to produce a predetermined etch rate ratio of said insulating material to said photoresist thereby to control the angle of said sloping side wall formed in said insulating material.

9. A method for operating a reactive ion etching system for high resolution, highly uniform replication of a pattern of apertures in a layer of organic photoresist into an underlying layer of inorganic insulating material on a semiconductor wafer and containing silicon as the principal metallic element, the method producing anisotropic etching with no polymer formation on the wafer, with low polymer formation on surfaces of the chamber of the system, and with substantial etch rate selectivity for the insulating material over the photoresist material, the method comprising: disposing said wafer on the cathode structure within the chamber of said reactive ion etching system; supplying to said chamber a reactive gas mixture comprising principally $CHF_2$ doped with carbon dioxide in the range of about 5–15 percent by volume; and supplying radio frequency energy to said cathode structure to create a plasma of said reactive gas mixture.

10. The method of claim 9, wherein said radio frequency energy is supplied to said cathode structure at a power level which creates a power density in the range of about 0.18–0.26 watts/cm$^2$; said chamber is maintained at a pressure in the range of about 40–80 millitorr; and said reactive gas mixture is supplied at a total gas flow rate which produces a residence time of activated species in the range of about 6–30 seconds.

11. The method of claims 5, 7, or 10, wherein said fluorocarbon gas is doped with about 10 percent by volume of $CO_2$; said chamber pressure is maintained at about 70 millitorr; said radio frequency power level creates a power density of about 0.22 watts/cm$^2$; and said reactive gas mixture is supplied at a total gas flow rate which produces a residence time of activated species of about 20 seconds.

12. A reactive gas mixture adapted to be used in a reactive ion system for etching silicon nitride or silicon oxide layers at relatively high etch rates with high etch rate selectivity for both an underlying layer of silicon and an overlying layer of photoresist, said mixture comprising principally $CHF_3$ doped with carbon dioxide in the range of about 5–15 percent by volume.

* * * * *

UNITED STATES PATENT AND TRADEMARK OFFICE
CERTIFICATE OF CORRECTION

PATENT NO. : 4,376,672

DATED : March 15, 1983

INVENTOR(S) : David N. Wang et al.

It is certified that error appears in the above-identified patent and that said Letters Patent is hereby corrected as shown below:

Column 18, line 18, "$CHF_2$" should read -- $CHF_3$ --.

Column 7, line 25, "abovestated" should read -- above stated --.

Column 7, line 44, "actal" should read -- actual --.

Signed and Sealed this

Twenty-third Day of August 1983

[SEAL]

Attest:

GERALD J. MOSSINGHOFF

Attesting Officer

Commissioner of Patents and Trademarks